United States Patent
Ritter

(10) Patent No.: US 9,594,137 B2
(45) Date of Patent: Mar. 14, 2017

(54) CONTROLLING MAGNETIC RESONANCE SYSTEMS

(71) Applicant: Dieter Ritter, Fürth (DE)

(72) Inventor: Dieter Ritter, Fürth (DE)

(73) Assignee: Siemens Aktiengesellschaft, München (DE)

( * ) Notice: Subject to any disclaimer, the term of this patent is extended or adjusted under 35 U.S.C. 154(b) by 1006 days.

(21) Appl. No.: 13/847,859

(22) Filed: Mar. 20, 2013

(65) Prior Publication Data

US 2013/0257430 A1  Oct. 3, 2013

(30) Foreign Application Priority Data

Mar. 30, 2012 (DE) .................. 10 2012 205 292

(51) Int. Cl.
*G01V 3/00* (2006.01)
*G01R 33/54* (2006.01)
(Continued)

(52) U.S. Cl.
CPC ....... *G01R 33/543* (2013.01); *G01R 33/5612* (2013.01); *G01R 33/5659* (2013.01)

(58) Field of Classification Search
CPC .................................................. G01R 33/5612
(Continued)

(56) References Cited

U.S. PATENT DOCUMENTS 6,362,623 B1  3/2002  Goto
8,779,769 B2 *  7/2014  Ritter ................. G01R 33/4836
                                                     324/309

(Continued)

FOREIGN PATENT DOCUMENTS

CN  1278422 A  1/2001
CN  1279928 A  1/2001
(Continued)

OTHER PUBLICATIONS

German Office Action dated Feb. 28, 2013 for corresponding German Patent Application No. DE 10 2012 205 292.5 with English translation.
(Continued)

*Primary Examiner* — Louis Arana
(74) *Attorney, Agent, or Firm* — Lempia Summerfield Katz LLC

(57) ABSTRACT

Methods for controlling magnetic resonance systems having a plurality of high frequency transmission channels through which HF pulse trains are emitted in parallel during operation are described. The methods involves specifying a joint reference pulse train for a plurality of the high frequency transmission channels, and determining a transmission scaling factor for each of the high frequency transmission channels in an HF pulse-optimization method by taking into consideration a specified target magnetization to calculate the HF pulse trains for the transmission channels on the basis of the reference pulse train. During calculation of the transmission scaling factors, a target function is created independently of a target magnetization difference in at least a first optimization mode of the HF pulse-optimization method. The target magnetization difference is considered in the HF pulse-optimization method by way of a boundary condition function instead. Pulse optimization devices and magnetic resonance systems are described.

22 Claims, 3 Drawing Sheets

(51) Int. Cl.
*G01R 33/561* (2006.01)
*G01R 33/565* (2006.01)

(58) Field of Classification Search
USPC .................. 324/309, 307, 306, 314
See application file for complete search history.

(56) References Cited

U.S. PATENT DOCUMENTS

| | | | |
|---|---|---|---|
| 8,878,534 B2* | 11/2014 | Ritter | G01R 33/4836 324/307 |
| 9,194,923 B2* | 11/2015 | Yokosawa | A61B 5/055 |
| 2002/0135368 A1 | 9/2002 | Goto et al. | |
| 2003/0042905 A1 | 3/2003 | Miyazaki et al. | |
| 2007/0191705 A1 | 8/2007 | Deshpande et al. | |
| 2007/0255128 A1 | 11/2007 | Nistler | |
| 2008/0265889 A1 | 10/2008 | Zhai et al. | |
| 2009/0322329 A1 | 12/2009 | Diehl et al. | |
| 2009/0322330 A1 | 12/2009 | Adachi et al. | |
| 2010/0253344 A1 | 10/2010 | Fautz | |
| 2011/0156704 A1 | 6/2011 | Boernert et al. | |
| 2011/0241680 A1 | 10/2011 | Mossnang et al. | |
| 2011/0254545 A1 | 10/2011 | Gebhardt et al. | |
| 2011/0254546 A1 | 10/2011 | Ritter | |
| 2014/0292333 A1* | 10/2014 | Beck | G01R 33/543 324/309 |
| 2014/0361772 A1* | 12/2014 | Ritter | G01R 33/4838 324/309 |
| 2015/0219733 A1* | 8/2015 | Blasche | G01R 33/48 324/314 |

FOREIGN PATENT DOCUMENTS

| | | |
|---|---|---|
| CN | 1403054 A | 3/2003 |
| CN | 101609132 A | 12/2009 |
| CN | 101612042 A | 12/2009 |
| CN | 102210587 A | 10/2011 |
| DE | 102010015044 A1 | 10/2011 |
| DE | 102010015066 A1 | 10/2011 |
| JP | 2007283104 A | 11/2007 |
| JP | 2009511106 A | 3/2009 |
| JP | 2012502683 A | 2/2012 |
| WO | WO2010057093 A2 | 5/2010 |
| WO | WO2011033402 A1 | 3/2011 |

OTHER PUBLICATIONS

J. Lee et al., "Local SAR in Parallel Transmission Pulse Design", Magnetic Resonance in Medicine, vol. 67, pp. 1566-1578, (2012).
X. Wu et al., "Adapted RF Pulse Design for SAR Reduction in Parallel Excitation With Experimental Verification at 9.4 T", Journal of Magnetic Resonance, vol. 205, pp. 161-170, (2010).
Chinese Office action for related Chinese Application No. 201310100977.6, dated Oct. 20, 2015, with English Translation.
Office Action for related Japanese Patent Application No. 2013-75969, dated Jan. 10, 2017.

* cited by examiner

FIG 4

|  | $\Delta m_{opt} / \Delta m_B$ | $SB_{opt} / SB_B$ |
|---|---|---|
| $r_{\Delta m} = 1{,}00$ | 0 % | -42,0 % |
| $r_{\Delta m} = 1{,}05$ | +5,0 % | -50,4 % |
| $r_{\Delta m} = 0{,}95$ | -5,0 % | -15,8 % |

FIG 5

|  | $\Delta m_{opt} / \Delta m_B$ | $SB_{opt} / SB_B$ |
|---|---|---|
| $r_{SB} = 1{,}0$ | -6,2 % | 0,0 % |
| $r_{SB} = 1{,}2$ | -7,1 % | +20 % |
| $r_{SB} = 0{,}8$ | -4,6 % | -20 % |

CONTROLLING MAGNETIC RESONANCE SYSTEMS

RELATED APPLICATIONS

This application claims the benefit of German Patent Application No. DE 102012205292.5, filed Mar. 30, 2012, the entire contents of which are hereby incorporated herein by reference.

TECHNICAL FIELD

The present teachings relate generally to methods for controlling magnetic resonance systems.

BACKGROUND

In a magnetic resonance system or magnetic resonance tomography system, the body to be examined is conventionally exposed with the aid of a basic field magnetic system to a relatively high (e.g., 3 or 7 Tesla) basic field magnetic field (also called a "$B_0$ field"). In addition, a magnetic field gradient is applied with the aid of a gradient system. High-frequency excitation signals (HF signals) are then emitted via a high frequency transmitting system by suitable antenna devices in order to tilt the nuclear spin of certain atoms resonantly excited by this high frequency field so as to be spatially resolved about a defined flip angle with respect to the magnetic field lines of the basic magnetic field. This high frequency excitation or the resulting flip angle distribution will hereinafter also be called core magnetization or "magnetization" for short. With relaxation of the nuclear spin high frequency signals, magnetic resonance signals (also called a "$B_1$ field") are radiated. The magnetic resonance signals are received by suitable receiving antennae and then processed further. The desired image data can be reconstructed from the raw data thus acquired.

The high frequency signals for nuclear spin magnetization are emitted by a "whole body coil" (also called a "body coil") or, frequently, by local coils applied to the patient or test person. A typical construction for a whole body coil involves a cage antenna (birdcage antenna), which has a plurality of transmitting rods arranged around a patient area of the tomograph in which a patient is situated during examination so as to run parallel to the longitudinal axis. At the end side, the antenna rods are each annularly capacitively connected to each other.

Previously, whole body antennae have been operated in a "CP mode" (circularly polarized mode). For this purpose, a single temporal HF signal is given to all components of the transmitting antenna (e.g., all transmitting rods of a cage antenna). The pulses having identical amplitude are transferred to the individual components phase-offset and with a shift adapted to the geometry of the transmitting coil. For example, in the case of a cage antenna with 16 rods, the rods are each controlled in a staggered manner using the same HF magnitude signal with 22.5° phase shift. The result is then a high frequency field circularly polarized in the x/y plane (i.e., perpendicular to the longitudinal axis of the cage antenna running in the z direction).

It is possible to individually modify the high frequency signal to be emitted—that is, the incoming sequence of high frequency pulses (referred to herein as a "reference pulse train")—in terms of amplitude and phase, respectively, by way of a complex transmission scaling factor. As before, it is still possible to operate the antenna in a "CP mode" (i.e., to select the amplitude to be the same for all transmission channels and to merely provide for a phase shift adapted to the geometry of the transmitting coil). Furthermore, depending on the object to be examined, an "EP mode" (elliptically polarized mode) in which the high frequency field is elliptically rather than circularly polarized in the x/y plane is also used. The choice of mode to use typically depends on the shape of the area of the body to be excited. Generally speaking, the CP mode is used with objects that are more cylindrically symmetrical (e.g., regions of the head), whereas the EP mode is used with more elliptical shapes (e.g., regions of the chest or abdomen). The EP mode compensates for non-homogeneities in the $B_1$ field, which are caused by non-circularly symmetrical body shapes.

It is possible to carry out "$B_1$ shimming" of a multi-channel high frequency transmitting system. In this case, the individual transmission scaling factors are calculated on the basis of a patient-specific adjustment with the aim of attaining particularly homogenous excitation compared with the previous standard CP or EP mode.

To calculate the transmission scaling factors, optimizers are used which minimize the magnitude of the difference between the perfectly homogeneously desired target magnetization m and the theoretically attained actual magnetization A·b:

$$b=\arg_b\min(\|A\cdot b-m\|^2+\beta^2\|b\|^2) \quad (1).$$

In equation (1) above, A represents the design matrix comprising a system of linear complex equations, in which, inter alia, the spatial transmitting profiles of the individual transmission channels (e.g., antenna rods) and the existing $B_0$ field distribution are entered. This design matrix is described, for example, by W. Grissom et al. in an article entitled "Spatial Domain Method for the Design of RF Pulses in Multicoil Parallel Excitation" (*Mag. Res. Med.*, 2006, 56, 620-629). b(t) represents the vector of the HF curves, $b_C(t)=SF_C\cdot b_R(t)$ to be emitted in parallel, wherein $SF_C$ is the complex scaling factor for the channel C= 1, . . . , N.

If the solution to equation (1)—that is, the minimum of the "target function" defined in equation (1)—is found, the desired scaling factors $SF_1, SF_2, \ldots, SF_N$ exist as a result.

Tikhonov regularization (i.e., the second summand in the target function of equation (1)) is used as an expansion of the target function, wherein solutions for small vectors b are preferred which include optimally small high frequency amplitudes. Since the high frequency voltage goes into the calculation of the output power squared, the high frequency exposure (HF exposure) of the patient can thus be reduced with $B_1$ shimming. The HF exposure has to be limited since excessive HF exposure may harm the patient. The HF exposure of the patient is therefore first calculated in advance during planning of the high frequency pulses to be emitted and the high frequency pulses are selected such that a certain limit is not reached. As used herein after, HF exposure refers to a physiological exposure induced by HF radiation rather than the introduced HF energy as such. A typical measure for the HF exposure is what is known as the SAR (Specific Absorption Rate) value, which indicates in units of watts/kg what biological exposure is acting on the patient due to a certain HF pulse power. By way of example, a standardized limit of 4 watts/kg in the "First Level" to the IEC standard applies for the global SAR or HF exposure of a patient. In addition, apart from pre-planning, the SAR exposure of the patient is continuously monitored during examination by way of suitable safety mechanisms on the magnetic resonance system and a measurement is changed or aborted if the HF exposure lies above the provided standards. However, optimally exact planning in advance is expedient to avoid termination of a measurement since this would make a new measurement necessary.

The factor $\beta$ in equation (1) is a free parameter known as the Tikhonov parameter, which can be selected during solution-finding to choose between optimum homogeneity and optimally low HF exposure.

HF exposure can vary greatly locally since due to $B_1$ shimming, the high frequency pulses are emitted on the individual channels with different amplitude and phase and the overlaying of these pulses (i.e., the mutual cancellation or amplification, which differs from place to place, in the object to be examined) is no longer trivial. There are some areas, therefore, where HF exposure is significantly higher locally than in other regions.

In recent methods, local HF exposure is monitored in the target function in which the HF exposure at particularly defined "virtual observation points" (VOPs) is theoretically calculated. In this regard, local HF exposure does not refer to the HF amplitude which occurs in one place or in a certain volume unit but rather the energy exposure resulting therefrom or the physiological exposure induced by the HF radiation, (e.g., in the form of an Specific Energy Dose or SED value or the SAR value in a certain local volume, such as the VOPs). The HF local exposure value used in the target function can be based, for example, on one or more local SAR values or SED values. This is described for a free individual determination of the high frequency pulse $b_c(t)$ by a suitable target function in DE 10 2010 015 044 A1, to which reference can be made hereinafter in relation to the calculation of such VOPs (also called "hot spots").

If the target function of equation (1) is used for monitoring local HF exposure, neither an approximate qualitative prediction of HF exposure nor the image quality (i.e., the anticipated difference in actual magnetization from the target magnetization) is possible in the Tikhonov regularization when adjusting the parameter $\beta$—only whether greater weighting is placed on the image quality or reduced HF exposure during optimization.

SUMMARY AND DESCRIPTION

The scope of the present invention is defined solely by the appended claims, and is not affected to any degree by the statements within this summary.

By way of introduction, a control method and a suitable pulse optimization device with which $B_1$ shimming is possible allows an improved prediction of HF exposure and/or image quality.

Some embodiments of the present teachings provide a method for controlling a magnetic resonance system having a plurality of high frequency transmission channels, through which HF (high frequency) pulse trains are emitted in parallel during operation. A joint reference pulse train is specified for a plurality of the high frequency transmission channels and a transmission scaling factor is determined for each of the high frequency transmission channels in an HF pulse-optimization method by taking into consideration a specified target magnetization for each of the high frequency transmission channels to calculate the HF pulse trains for the transmission channels on the basis of the reference pulse train.

In some embodiments, the present teachings also provide for a pulse optimization device to determine, within the framework of such an HF pulse-optimization method, the transmission scaling factors for the individual high frequency transmission channels. In some embodiments, the present teachings also provide for a magnetic resonance system having such a pulse optimization device.

BRIEF DESCRIPTION OF THE DRAWINGS

FIG. 4 shows an example table of relative target magnetization differences and relative HF exposure values that were attained using an HF pulse-optimization method embodying features of the present teachings in a first optimization mode.

FIG. 5 shows an example table with relative target magnetization differences and relative HF exposure values that were attained using an HF pulse-optimization method embodying features of the present teachings in a second optimization mode.

DETAILED DESCRIPTION

Figure 1:
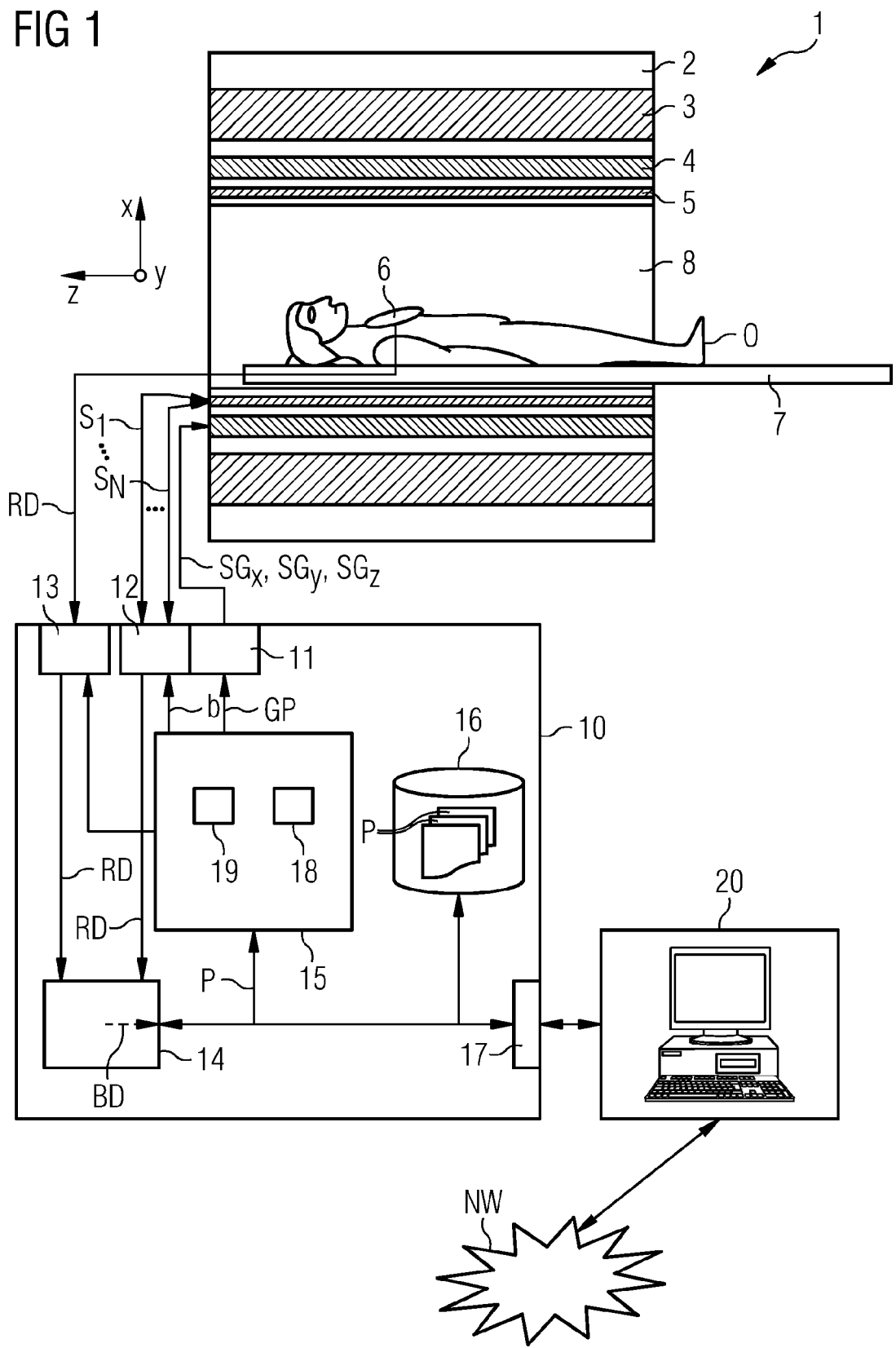
FIG. 1 shows a schematic diagram of a magnetic resonance system embodying features of the present teachings.

By way of general introduction, a method for controlling a magnetic resonance system embodying features of the present teachings comprises a plurality of, in principle, independently controllable high frequency transmission channels through which parallel HF pulse trains are emitted during operation. A joint reference pulse train is specified for a plurality—preferably all—of the high frequency transmission channels. Furthermore, in an HF pulse-optimization method, an individual complex transmission scaling factor is determined by taking into consideration a specified target magnetization for each of the high frequency transmission channels in order to calculate the HF pulse trains for the transmission channels on the basis of the reference pulse train (e.g., to scale or multiply with/by the reference pulse train for the relevant high frequency transmission channel, as described above).

At least in a first optimization mode, a target function is created in the HF pulse-optimization method independently of a target magnetization difference during calculation of the transmission scaling factors. The target magnetization difference is a measure of the difference in the actual magnetization theoretically attained with the high frequency pulses determined during optimization from the target magnetization, corresponding to the first term in the target function according to equation (1). In other words, an image quality condition, which states how easily the target magnetization can be attained, is involved.

This target magnetization difference is considered in the HF pulse-optimization method by way of a boundary condition function instead.

In this first optimization mode, by way of example, the target function can be constructed in such a way that it depends solely on HF exposure. Examples of this will be described below in reference to the drawings. The image quality condition and the HF exposure condition are preferably completely separated at least in this first operating mode.

As further described below, it has been found—surprisingly and unexpectedly—that a relatively accurate predictable image quality can be attained in this way. Moreover, it has been further found—also surprisingly and unexpectedly—that at the same time, it is possible to significantly reduce the HF exposure.

For this purpose, the target function and the boundary condition function are set up in a suitable way and a "solver" (i.e., an optimization program for solving the target function), which is capable of also taking boundary condition functions into consideration, is used. "Constrained solvers" of this type are known to those of ordinary skill in the art. One representative suitable program module having such a constrained solver is, by way of example, the Interior-Point Subalgorithm belonging to the "fmincon" optimizer from the MathWorks Optimization Toolbox, available from The MathWorks, Inc. (Natick, Mass.). However, any other constrained solver may also be used.

In accordance with the present teachings, a suitable pulse optimization device for a magnetic resonance system that comprises a plurality of high frequency transmission channels is configured to create, at least in a first optimization mode, a target function in the HF pulse-optimization method independently of a target magnetization difference, and to consider the target magnetization difference by way of a boundary condition function in the HF pulse-optimization method instead.

In addition to the plurality of high frequency transmission channels and other system components—such as, by way of example, a gradient system, basic field magnets, a controller designed to emit HF pulse trains in parallel via the high frequency transmission channels in order to carry out a desired measurement—a magnetic resonance system in accordance with the present teachings also comprises a pulse optimization device of a type described herein.

In some embodiments, the pulse optimization device can be part of the controller of the magnetic resonance system. In other embodiments, the pulse optimization device can be located in an external computer, connected to the controller (e.g., via a network), an operator terminal or another computer for outsourcing computer-intensive processes.

In some embodiments, at least a majority of the pulse optimization device is constructed in the form of software. Thus, in some embodiments, a computer program is provided, which can be loaded directly into the memory of a pulse optimization device and/or a controller, which comprises program code parts in order to execute all acts of a method embodying features of the present teachings if the program is executed in the pulse optimization device and/or a controller. Such a software implementation has an advantage in that previous devices, which have been used to determine transmission scaling factors or for $B_1$ shimming (e.g., controllers of existing magnetic resonance systems), can be suitably modified by way of implementation of the program to carry out $B_1$ shimming in accordance with the present teachings.

The dependent claims and the following description include particularly advantageous developments and embodiments, wherein, in particular, the claims of one category can also be developed analogously to the dependent claims of a different claims category. It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding claim—whether independent or dependent—and that such new combinations are to be understood as forming a part of the present specification.

A pulse optimization device embodying features of the present teachings is preferably constructed in such a way that it can also be operated in a second optimization mode. Conventionally, in the second optimization mode of the HF pulse-optimization method, the target function is created in such a way that it includes a target magnetization difference. However, in accordance with the present teachings, the target function does not include an HF exposure value of the object to be examined; rather, the HF exposure value is taken into consideration by way of a boundary condition function instead. In this second optimization mode, the target magnetization difference and the HF exposure condition are completely separated into different functions.

For this purpose, an optimization mode indicator can be provided before or at the start of the HF pulse-optimization method and, based thereon, the HF pulse-optimization method is then carried out according to the first optimization mode or the second optimization mode. The optimization mode indicator can be acquired, by way of example, via a suitable interface of the pulse optimization device or controller of the magnetic resonance system. In some embodiments, this may be a user interface through which an operator can specify the optimization mode indicator. Alternatively, the optimization mode indicator can be specified by a control protocol which includes most of the other parameters for a measurement to be carried out and is gradually automatically processed during the course of the measurement.

In some embodiments, the HF exposure value considered in the target function or boundary condition function can be an HF local exposure value in which high frequency exposure locally present in a certain location is taken into consideration, as described for example in DE 10 2010 015 044 A1. In other embodiments, a global HF exposure value, averaged for example over the whole of a patient's body, or a combined HF exposure value, which takes into consideration both the HF local exposure value and a global exposure value, can instead be used in the HF pulse-optimization method in the target function or boundary condition function.

The boundary condition function is chosen such that the function defines a permissible difference in a parameter value of a certain parameter from a relative reference parameter value. In some embodiments, a difference of zero can be specified (i.e., that the relative reference parameter value specified in the boundary condition function must be adhered to exactly). However, a specification is also possible whereby, by way of example, a parameter value, achieved in the optimization method, of the parameter monitored in the boundary condition function must always lie below the reference parameter value, etc.

In some embodiments, in the first optimization mode in which the target magnetization difference is taken into consideration in the boundary condition function, the parameter value is the current target magnetization difference. In this case, the maximum difference in the target magnetization difference from a relative reference target magnetization difference is then defined.

In some embodiments, in a second optimization mode in which the high frequency exposure value is taken into consideration in the boundary condition function, the maximum difference of the HF exposure value from a relative reference HF exposure value is defined by contrast.

A relative reference parameter value (e.g., the relative reference target magnetization difference or relative reference HF exposure value) refers to a value that can be based, by way of example, on a different operating mode of the magnetic resonance system. This is expedient in this respect since, within the framework of $B_1$ shimming, only scaling factors are determined which represent actual target magnetization, and in particular HF exposure, but which are still dependent on the reference pulse train, which cannot be changed in $B_1$ shimming. Thus, the reference parameter value is defined on the basis of a parameter value of the relevant parameter that can be achieved in a basic excitation mode. The phrase "basic excitation mode" refers to the standard mode used for the relevant examination following the previous procedure without $B_1$ shimming (e.g., CP mode in the case of a head examination and EP mode in the case of abdominal examination). In other words, a comparison is made with values which would be achievable with high frequency pulse trains on the transmission channels which are based on the same reference pulse train, albeit with transmission scaling factors corresponding to the basic excitation mode for the relevant examination.

For this purpose, a relational value is preferably acquired before or at the beginning of the HF pulse-optimization method and, based thereon, the reference parameter value is then defined relative to the parameter value of the relevant parameter which can be achieved in the basic excitation mode. In some embodiments, such a relational value can be a factor or a detail in percent in order to determine to what proportion a certain relative reference parameter value should be achieved. In some embodiments, it can be specified by the relational value with the aid of the boundary condition, that in the case of a measurement of the head area, which would otherwise be carried out in the CP mode, $B_1$ shimming can occur in such a way that target magnetization is achieved to at least the same extent as in the CP mode.

In some embodiments, by way of example, it can be established in the second optimization mode that HF exposure should be 40% lower than in a conventional CP mode, as controlled by the boundary condition function, and, moreover, that optimization in relation to the image quality occurs.

It has been found that methods embodying features of the present teachings have considerable strengths when applied to simple 2-channel systems in which, by way of example, a birdcage antenna is provided with only two supply points located at 90° to one other, as is the case with many of the systems that exist nowadays in hospitals. The minor modifications proposed in accordance with the present teachings mean significant improvements may be achieved even in systems of this kind. It should be noted that the number of transmission channels contemplated for use in accordance with the present teachings is not restricted.

Representative embodiments in accordance with the present teachings will now be further described in reference to the accompanying drawing figures. It is to be understood that elements and features of the various representative embodiments described below may be combined in different ways to produce new embodiments that likewise fall within the scope of the present teachings.

FIG. 1 shows schematically a magnetic resonance unit 1 or magnetic resonance system including a magnetic resonance scanner 2 with an examination space/patient tunnel 8 located inside the scanner 2. An examination table 7 can be moved into patient tunnel 8 so that during an examination, a patient O or test person lying on the table 7 can be placed at a certain position inside the magnetic resonance scanner 2 relative to the magnetic system and high frequency system arranged therein and/or can also be moved between different positions during a measurement.

Fundamental components of the magnetic resonance scanner 2 are a basic field magnet 3, a gradient system 4 with magnetic field gradient coils to apply any desired magnetic field gradients in the x, y and z directions, and a whole body high frequency coil 5. Magnetic resonance signals induced in the object to be examined O can be received via the whole body coil 5, with which, in some embodiments, high frequency signals are also emitted to induce the magnetic resonance signals. These signals are received by local coils 6 laid, by way of example, on or under the object to be examined O.

As shown in FIG. 1, the whole body high frequency coil 5 is in the form of a birdcage antenna, and comprises a number N of individual antenna rods that run parallel to the patient tunnel 8 and are arranged around a circumference of the patient tunnel 8 so as to be uniformly distributed. At the end side, the individual antenna rods are each capacitively annularly connected.

In some embodiments, the antenna rods can be separately controlled as individual transmission channels $S_1, \ldots, S_N$ by a controller 10. In some embodiments, the controller 10 comprises a control computer which, in some embodiments, includes a large number of individual computers (which, optionally, are spatially separate and connected to each other by suitable cables or the like). The controller 10 is connected to a terminal 20 by a terminal interface 17 through which a user can control the entire system 1. In some embodiments, terminal 20 is equipped with a keyboard, one or more screens, and further input devices, such as, by way of example, a mouse or the like, such that a graphic user interface is available to the operator.

The controller 10 comprises, inter alia, a gradient control unit 11 which in turn can include a plurality of sub-components. The individual gradient coils can be activated by control signals $SG_x$, $SG_y$, $SG_z$ via gradient control unit 11. In some embodiments, these are gradient pulses which, during a measurement, are placed at precisely provided temporal positions and have a precisely specified temporal course.

In some embodiments, the controller 10 also comprises a high frequency transceiver unit 12 which, in some embodiments, may comprise a plurality of sub-components in order to place high frequency pulses in each case separately and in parallel on the individual transmission channels $S_1, \ldots S_N$ (i.e., the individually controllable antenna rods of the whole body high frequency coil 5). Magnetic resonance signals may also be received via the transceiver unit 12, which can also occur with the aid of local coils 6. The signals received by the local coils 6 can be read out and processed by an HF receiving unit 13. The magnetic resonance signals thus received, or received by the whole body coil by HF transceiver unit 12, can be passed as raw data RD to a reconstruction unit 14, which reconstructs the image data BD therefrom and stores the data in a memory 16 and/or passes the data via an interface 17 to a terminal 20 so an operator can examine the image data BD. The image data BD can also be stored via a network NW at different locations and/or be displayed and evaluated.

In some embodiments, the gradient control unit 11, the high frequency transceiver unit 12, and the receiving unit 13 for the local coils 6 are each controlled in a coordinated manner by a measuring control unit 15. By way of appropriate commands, this ensures that a desired gradient pulse train GP is emitted by suitable gradient control signals $SG_x$, $SG_y$, $SG_z$, and simultaneously controls the HF transceiver unit 12 in such a way that a multi-channel-pulse train b is emitted (i.e., appropriate high frequency pulses are simultaneously given on the individual transmission channels $S_1, \ldots S_N$ to the individual transmitting rods of the whole body coil 5). In some embodiments, the magnetic resonance signals on the local coils 6 are read out at an appropriate time by the HF receiving unit 13—or, in some embodiments, signals on the whole body coil 5 are read out by the HF transceiver unit 12—and processed further. The measuring control unit 15 is configured to pass the corresponding signals, in particular the multi-channel pulse train b, on to the high frequency transceiver unit 12, and the gradient pulse train GP to the gradient control unit 11, as a function of a control sequence specified in a control protocol P. All control data to be adjusted during a measurement can be stored in control protocol P.

In some embodiments, a large number of control protocols P for different measurements can be stored in a memory 16. These could be selected by an operator via terminal 20 and, optionally, be varied to have available a suitable control protocol P for a currently desired measurement with which the measuring control unit 15 can operate. Furthermore, in some embodiments, the operator can also retrieve control protocols P from a manufacturer of the magnetic resonance system 1 via a network NW, and then optionally modify and use them.

The underlying sequence of a magnetic resonance measurement and components for controlling such measurements are known to those of ordinary skill in the art and, therefore, do not require detailed description. It should be noted that in some embodiments, magnetic resonance scanner 2 and/or associated controller 10 can comprise a large number of additional components in addition to or as alternatives to the representative components shown and described herein.

In some embodiments, the magnetic resonance scanner 2 can be constructed with a different configuration, such as with a patient space that is open at the side. Moreover, in some embodiments, the high frequency whole body coil does not have to be constructed as a birdcage antenna provided that it comprises a plurality of separately controllable transmission channels $S_1, \ldots, S_N$ or, in the simplest case, two transmission channels.

In some embodiments, the measuring control unit of the controller includes, in the form of software modules, a reference pulse-generating module 18, which is configured to generate a reference pulse train $b_R$ according to the specifications in the control protocol P, which is to be played in a suitable manner relative to the gradient pulses. The reference pulse train $b_R$ is first passed to a pulse optimization device 19 which, in some embodiments, can also be constructed as a software module inside the measuring control unit 15. In accordance with the present teachings, the pulse optimization device 19 can serve to determine in an HF pulse-optimization method or a $B_1$ shimming method an individual complex transmission scaling factor $SF_1, \ldots, SF_N$ for each of the high frequency transmission channels $S_1, \ldots, S_N$.

Figure 2:
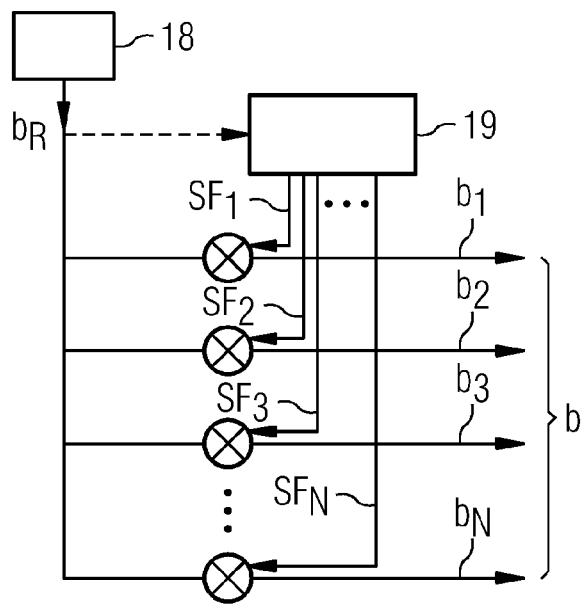
FIG. 2 shows a figure illustrating example $B_1$ shimming.

FIG. 2 shows schematically a $B_1$ shimming method or an HF pulse-optimization method OV. As shown in FIG. 2, the reference pulse train $b_R$ is first passed to the pulse optimization device 19, which—as will be described later with the aid of FIG. 3—determines the complex transmission scaling factors $SF_1, SF_2, SF_3 \ldots, SF_{Nr}$. As shown in FIG. 2, these are multiplied by the reference pulse train $b_R$ to obtain the individual pulse trains $b_1, b_2, b_3, \ldots, b_N$, which then jointly form the multi-channel-pulse train b emitted via the high frequency transceiver unit 12.

Alternatively, in some embodiments, the pulse optimization device 19 can be constructed separately from the measuring control unit 15 or be part of the high frequency transceiver unit 12 such that, by way of example, multiplication by the complex transmission scaling factors $SF_1, SF_2, SF_3 \ldots, SF_N$ can occur in terms of hardware. In some embodiments, the reference pulse-generating module 18 can also be a separate device or, in some embodiments, part of the high frequency transceiver unit 12. The basics of a $B_1$ shimming method and the associated devices are known those of ordinary skill in the art In contrast to a conventional $B_1$ shimming method, and in accordance with an exemplary embodiment of the present teachings, there is a possibility of carrying out HF pulse-optimization in at least two different optimization modes, $OM_1$ and $OM_2$. In the two optimization modes, $OM_1$ and $OM_2$, there is in each case a complete separation of the target magnetization difference (i.e., the image quality condition) and an HF exposure condition into a target function and a boundary condition function or vice versa. This separation is described in more detail with the aid of FIG. 3.

An optimization method begins in act I with the input of an optimization mode indicator OMI. In some embodiments, this can be done by an operator via terminal 20 at the start of a measurement or when the operator retrieves a protocol P and adapts the protocol P to the current measurement. Alternatively, in some embodiments, this optimization mode indicator OMI can already be stored as a value in the control protocol P and then changed as desired by the operator.

In act II, it is decided on the basis of the optimization mode indicator OMI whether the optimization method is carried out in the first optimization mode $OM_1$ or second optimization mode $OM_2$.

Acts III.1 and IV.1 are run through in the first optimization mode $OM_1$, and acts III.2 and IV.2 are run through in the second optimization mode $OM_2$. Within this framework, one target function $f_Z$ and one boundary condition function $f_C$ are fixed, and then conventionally used in an act V to determine the optimum transmission scaling factors $SF_1, \ldots, SF_N$. In some embodiments, a conventional constrained solver, including but not limited to the fmincon solver from The Mathworks, Inc. described above, can be used in act V for this purpose.

If the first optimization mode $OM_1$ has been selected, a target function $f_Z$ is used which is not dependent on an image quality value. Thus, the target function $f_Z$ does not contain the target magnetization difference $\Delta m$, which indicates how much the actual magnetization differs from the desired target magnetization m. Instead, the target magnetization difference $\Delta m$ inside the boundary condition function is used.

For this purpose, a relational value $r_{\Delta m}$ is first acquired in act III.1, which indicates to what extent (e.g., to what percentage) the result of the optimization method matches a target magnetization difference $\Delta m$ that would be achieved in a measurement using a basic excitation mode for the examination (e.g., in a CP mode or an EP mode).

The set up of the functions for the optimization that follows in act V (i.e., the two functions supplied to the constrained solver) occurs in act IV.1. The target function $f_Z(SB)$ is dependent on a high frequency exposure value SB. An example of such a target function is shown in (2) below:

$$b = \arg_b \min(f(SED_{loc})) \qquad (2).$$

In equation (2), $SED_{loc}$ represents the local exposure vector of the local SED values $SED_{loc,h}$ (in [Ws/kg]). These local SED values $SED_{loc,h}$ at a VOP (Virtual Observation Point) h in the body of the object to be examined O can be calculated using equation (3):

$$SED_{loc,h} = 0.5 \cdot \text{real}\left(\sum_{c=1}^{N} \sum_{c'=1}^{N} ZZ_{hcc'} \cdot T_{cc'}\right) \cdot \frac{1}{\rho_h}. \quad (3)$$

In equation (3), N represents the number of independent transmission channels, $\rho_h$ is the density of the patient at the VOP h in kg/m$^3$, and c and c' are control variables that run from 1 to N (where N is the number of transmission channels). The values $ZZ_{hcc'}$ are the individual elements of what is known as a sensitivity matrix ZZ. In equation (3), the sensitivity matrix ZZ contains a sensitivity value for each VOP h, which, when multiplied by the amplitude of the HF field, represents the E field in the relevant VOP and forms a conversion factor for the amplitude of the high frequency curve to the actual energy exposure in the VOP. By way of illustration, if 30 such VOPs are observed, the HF local exposure vector $SED_{loc}$ will contain 30 vector elements according to equation (3).

$T_{cc'}$ in equation (5) below is the cross correlation of the HF curves of the HF pulse train:

$$T_{cc'} = \Delta t \cdot \sum_{c=0}^{N} conj(b'_c) \cdot b_c. \quad (5)$$

In equation (5), $\Delta t$ represents the sampling interval in s. This cross correlation indicates whether the HF curves of the HF pulse train are increased or reduced at a certain location in the case of overlaying.

In some embodiments, the sensitivity matrix ZZ and the target function can be stored in a memory 16 of controller 10 and be recalled from there as required. In some embodiments, the sensitivity matrix may be determined in advance by simulations on body models. A method for determining such a sensitivity matrix and the local SED values $SED_{loc}$ is described, for example, in DE 10 2009 024 077. Different sensitivity matrices can also be stored for different body types (e.g., patients of different sizes) as further described in DE 10 2010 015 044 A1, wherein the local exposure vector is also used.

The local exposure function term $f(SED_{loc})$ in equation (2) can be configured in various ways. By way of example, it may be the quadratic maximum norm max$^2(SED_{loc})$, which leads to the critical maximum of the local SED vectors (i.e., the largest hot spot) being minimized.

In a preferred embodiment, $f(SED_{loc}) = \|SED_{loc}\|^2$ is set, which leads to HF energy being removed from the more critical VOPs in the list and energy being supplied to other less critical VOPs, since use of the quadratic standard $\| \|^2$ overall in optimization means that a minimization of the quadratic interval of the local SED vector from zero is achieved.

By contrast, the boundary condition function $f_C(\Delta m)$ is dependent on the target magnetization difference $\Delta m$. One example of this is shown by the function in equation (6)

$$\|A \cdot b| - |m|\|^2 = r_{\Delta m} \cdot \|A \cdot b| - |m|\|^2_{CP/EP} \quad (6.)$$

The left side of equation (6) gives the target magnetization differential value $\Delta m = \|A \cdot b| - |m|\|^2$ which can be achieved with the transmission scaling factors currently calculated in the optimization. This should match the target magnetization differential value $\Delta m = \|A \cdot b| - |m|\|^2_{CP/EP}$ correspondingly achievable in a basic excitation mode (i.e., in the CP mode or EP mode) multiplied by the relational value $r_{\Delta m}$. The basic excitation (e.g., the CP mode or EP mode), is shown in equation (6) and below by use of the subscript CP/EP. Instead of an equation, an inequality may be chosen (i.e., optimization occurs such that the achieved target magnetization differential value is always below the target magnetization differential value in the CP or EP mode, multiplied by the relational value $r_{\Delta m}$)

The following three examples, described in reference to the values in the Table shown in FIG. 4, illustrate features in accordance with the present teachings, and are provided solely by way of illustration. They are not intended to limit the scope of the appended claims or their equivalents.

In FIG. 4, the relational values $r_{\Delta m}$ for the boundary condition function according to equation (3) are given in the first column in the form of a factor in each case. The relative target magnetization difference $\Delta m_{opt}$ achieved within the framework of the HF pulse-optimization method according to the first optimization mode after optimization is given in relation to the achievable target magnetization difference $\Delta m_B$ in the basic excitation mode, (e.g., in the CP or EP mode) as a percentage in the second column. A negative sign (i.e., a reduction in the target magnetization difference) corresponds to an improvement in the image quality.

The value for the (relative) HF exposure $SB_{opt}$ achieved by the optimization method in relation to an HF exposure $SB_B$ which occurs in the basic excitation mode is given in the third column in FIG. 4 in the form of the percentage difference (negative sign corresponding to a reduction in the HF exposure). In the case of the high frequency exposure values SB shown in FIG. 4, these are each local SED exposure values in the form $\|SED_{loc}\|^2$, as described above in connection with equation (3).

A relational value $r_{\Delta m}=1$ is chosen in the first row (i.e. the target magnetization difference) and, consequently, the image quality should not change with respect to the normal basic excitation mode. The difference between the target magnetization difference when emitting the HF pulses with the optimized transmission scaling factors and that of the target magnetization difference when using conventional transmission scaling factors in the basic excitation mode therefore lies at 0% as required. It can be seen from the last column in FIG. 4 that due to optimization, the high frequency exposure could be reduced by 42% as compared with the basic excitation mode.

In a further experiment shown in FIG. 4, the relational value was set at $r_{\Delta m}=1.05$ corresponding to an increase in the target magnetization difference with the optimized pulses of 5% compared to the target magnetization difference in the basic excitation mode. There is also a difference compared with the target magnetization difference in the basic excitation mode of +5% after optimization as well, as can be seen from the value in the second column. As shown in the third column, a total HF reduction in exposure compared with the basic excitation mode of 50.4% has been achieved. Thus, if the operator is of the view that the image quality in the basic excitation mode (e.g., CP or EP mode) is sufficiently good and could even be 5% worse without causing a problem when evaluating the images, then the relational value $r_{\Delta m}$ of 1.05 could also be chosen in favor of reduced HF exposure.

A relational value $r_{Dm}=0.95$ was chosen for the third experiment shown in FIG. 4. As shown in FIG. 4, this leads to a 5% improvement in the image quality as evidenced by the −5.0% value given for the relative change in target magnetization difference $\Delta m$ in the second column. Although an improvement in the image quality is achieved by the boundary condition, a reduction in the high frequency exposure of 15.8% compared with the conventional basic excitation mode is also achieved, as may be seen in the third column.

As the values in the Table in FIG. 4 show, by using a method in accordance with the present teachings in a first optimization mode, an operator can specify exactly what image quality is desired in relation to conventional basic mode. Nevertheless, in each of these examples, a significant reduction can be achieved in relation to high frequency exposure even with an improvement in the image quality.

Figure 3:
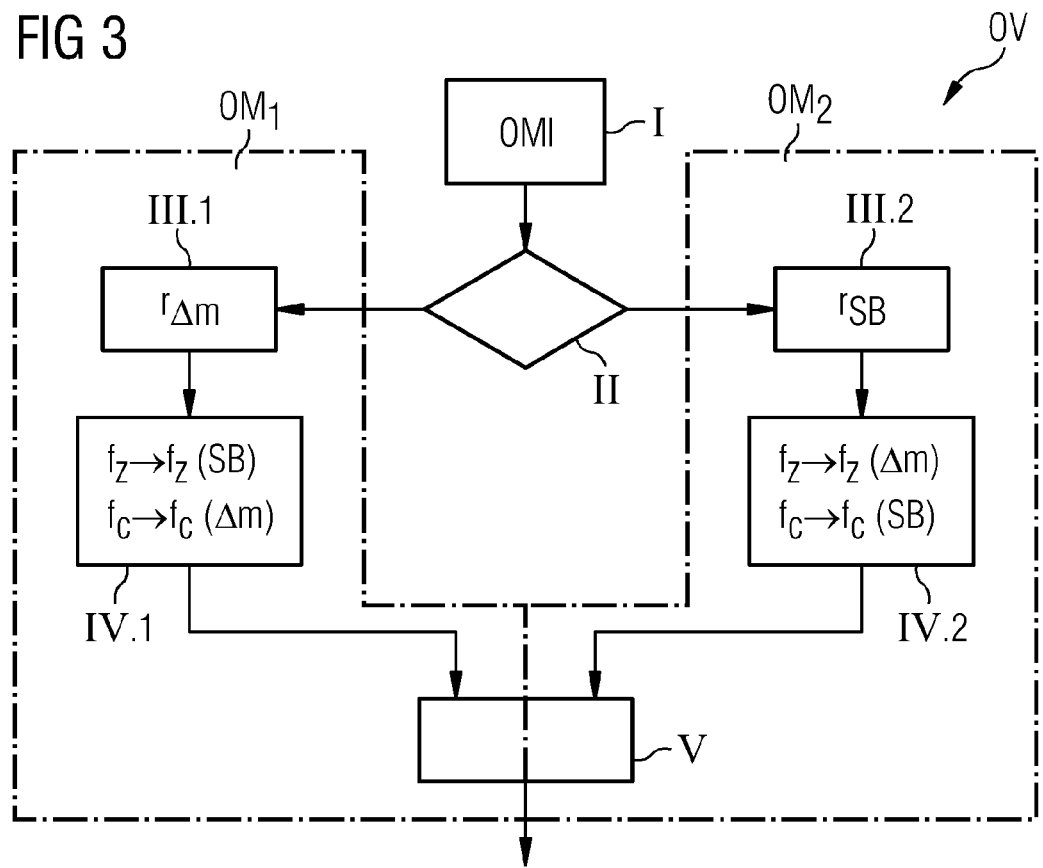
FIG. 3 shows a flowchart for a representative sequence in accordance with the present teachings.

If in act I of FIG. 3 an optimization mode indicator OMI is chosen in accordance with the second optimization mode $OM_2$, a relational value $r_{SB}$ is first acquired in act III.2 that is then used in act IV.2 to construct the boundary condition function on the basis of the high frequency exposure.

The target function $f_Z(\Delta m)$ is chosen as a function of the target magnetization difference $\Delta m$ with optimization mode $OM_2$. Such a target function can be formed, by way of example, as shown in equation (7):

$$b = \arg_b \min(\||A \cdot b| - |m|\|^2) \quad (7)$$

A comparison with equation (1) shows that this target function resembles a conventional target function with the exception that HF exposure is now no longer taken into consideration within the target function $f_Z$ itself. Instead, the HF exposure is taken into consideration within the boundary condition function $f_C(SB)$. In some embodiments, a representative boundary condition function is as shown in equation (8):

$$\left(\sum_{c=1}^{N} \sum_{c'=1}^{N} ZZ_{hcc'} \cdot T_{cc'}\right) = r_{SB} \cdot \left(\sum_{c=1}^{N} \sum_{c'=1}^{N} ZZ_{hcc'} \cdot T_{cc'}\right)_{CP/EP} \quad (8)$$

This boundary condition function basically corresponds to monitoring of the local exposure vector $SED_{loc}$ (cf. equation (3)). However, the Euclidean norm $\|SED_{loc}\|^2$ of the local SED values of the local exposure vector $SED_{loc}$ (i.e. the VOPs) given by the sensitivity matrix $ZZ_{hcc'}$ and the cross correlation $T_{cc'}$ is not used. Instead, in equation (8), the maximum of the individual VOPs is taken into consideration (i.e., check that the specified maximum is not exceeded at the VOP with the greatest local exposure). The left side of equation (8) indicates the maximum of the local exposure vector that is achieved with the optimized transmission scaling factors. The right side of equation (8), indicated by the subscript CP/EP, represents the maximum that would be achieved with conventional CP or EP transmitting mode, multiplied by the relational value $r_{SB}$.

The following three examples, described in reference to the values in the Table shown in FIG. 5, illustrate features in accordance with the present teachings, and are provided solely by way of illustration. They are not intended to limit the scope of the appended claims or their equivalents.

In FIG. 5, three example measurements are given in relation to the second optimization mode $OM_2$. The table in FIG. 5 is constructed analogously to the table in FIG. 4 except that the relational values $r_{SB}$ with respect to HF exposure are now given in the first column. In the case of the disclosed high frequency exposure values SB in the last column, this embodiment also involves local SED exposure values in the form $\|SED_{loc}\|^2$, as described in connection with equation (3).

In the first row in FIG. 5, a relational value $r_{SB}=1$ is assumed for the first measurement, which means that the measurement has been carried out in such a way that the HF exposure is not allowed to change with respect to the HF exposure in conventional basic excitation mode (i.e., in CP or EP mode). This is also reflected in the attained value of 0% in the last column of the first row. Within the framework of optimization, aided by the target function of equation (7), a reduction of −6.2% in the target magnetization difference $\Delta m$ by is achieved (i.e., the image quality improves accordingly), as evidenced by the middle value in the first row.

In the measurement for the second row, a relational value $r_{SB}=1.2$ is specified. After optimization, the HF exposure has been permitted to be 20% higher than in the basic excitation mode, and as shown by the value of +20% in the last column. An even greater improvement in image quality has been achieved as compared to the first case (viz., an improvement of 7.1%). The improvement is evidenced by the middle column.

In the last experiment, a relational value $r_{SB}=0.8$ is specified. The boundary condition function specifies that the HF exposure after optimization of the transmission scaling factors lies 20% below the value in basic excitation mode (as evidenced by the −20% value in the last column). An improvement in image quality of 4.6% is still achieved in this case.

It has thus been demonstrated in the second optimization mode $OM_2$ that an improvement in HF exposure and simultaneous improvement in image quality is possible. In the second mode, the relational value of the achieved HF exposure can be set by an operator in relation to the conventional basic excitation. The operator can then use this second optimization mode $OM_2$—particularly when the operator knows in advance what high frequency exposure is desired or if a higher HF exposure would even still be possible. This is conceivable if a sequence is run through which the sequence is not connected to a particularly high frequency exposure (e.g., if the reference pulse train is already not associated with a very high HF exposure). The operator can thus achieve even greater improvements in image quality than in the first optimization mode while ensuring that the high frequency exposure does not increase too greatly.

The above examples show how a reduction in the HF exposure of a patient with concomitant improvement in image quality can already be achieved in accordance with the present teachings. It should be noted that the above description and its extensions are offered as exemplary embodiments and that the person skilled in the art can also vary the basic principle within wide ranges without departing from the scope of the invention insofar as it is predefined by the claims.

Unless already done elsewhere in this specification, the entire contents of each and every patent and non-patent publication cited herein are hereby incorporated by reference, except that in the event of any inconsistent disclosure or definition from the present specification, the disclosure or definition herein shall be deemed to prevail.

The foregoing detailed description and the accompanying drawings have been provided by way of explanation and illustration, and are not intended to limit the scope of the appended claims. Many variations in the presently preferred embodiments illustrated herein will be apparent to one of ordinary skill in the art, and remain within the scope of the appended claims and their equivalents.

The invention claimed is:

1. A method for controlling a magnetic resonance system, the magnetic resonance system comprising a plurality of high frequency transmission channels, the method comprising:
    specifying a joint reference pulse train for a plurality of the high frequency transmission channels;
    determining, in a high-frequency (HF) pulse-optimization, a transmission scaling factor for each high frequency transmission channel of the plurality of high frequency transmission channels, wherein each transmission scaling factor takes into consideration a specified target magnetization;
    calculating an individual HF pulse train for each high frequency transmission channel of the plurality of high frequency transmission channels based on the reference pulse train and the transmission scaling factor for the respective high frequency transmission channel; and
    emitting a multi-channel pulse train via a high frequency transceiver, the multi-channel pulse train comprising the calculated HF pulse trains,
    wherein, in determining the transmission scaling factors in the HF pulse optimization:
    (1) a target function is created independently of a target magnetization difference during calculation of the transmission scaling factors, the target magnetization difference being a measure of a difference in an actual magnetization theoretically attained with high frequency pulses determined during the HF pulse-optimization from the specified target magnetization, and wherein the target magnetization difference is considered in the HF pulse-optimization by way of a boundary condition function; or
    (2) the target function comprises the target magnetization difference and no HF exposure value of an object to be examined, and wherein the HF exposure value is considered by way of the boundary condition function.

2. The method of claim 1, wherein the target function is created independently of the target magnetization difference and the target magnetization difference is considered in the HF pulse-optimization by way of the boundary condition function, and wherein the target function comprises at least one HF exposure value of an object to be examined.

3. The method of claim 1, wherein the target function comprises the target magnetization difference and no HF exposure value of the object to be examined, and wherein the HF exposure value is considered by way of the boundary condition function.

4. The method of claim 3, further comprising providing an optimization mode indicator.

5. The method of claim 2, wherein the HF exposure value comprises a HF local exposure value.

6. The method of claim 3, wherein the HF exposure value comprises a HF local exposure value.

7. The method of claim 1, wherein the boundary condition function defines a permissible difference in a parameter value from a reference parameter value.

8. The method of claim 2, wherein the boundary condition function defines a permissible difference in a parameter value from a reference parameter value.

9. The method of claim 3, wherein the boundary condition function defines a permissible difference in a parameter value from a reference parameter value.

10. The method of claim 4, wherein the boundary condition function defines a permissible difference in a parameter value from a reference parameter value.

11. The method of claim 7, wherein the reference parameter value is defined based on a parameter value of the relevant parameter achievable in a basic excitation mode.

12. The method of claim 8, wherein the reference parameter value is defined based on a parameter value of the relevant parameter achievable in a basic excitation mode.

13. The method of claim 9, wherein the reference parameter value is defined based on a parameter value of the relevant parameter achievable in a basic excitation mode.

14. The method of claim 10, wherein the reference parameter value is defined based on a parameter value of the relevant parameter achievable in a basic excitation mode.

15. The method of claim 11, wherein a relational value is acquired and, based thereon, the reference parameter value is defined relative to the parameter value of the relevant parameter achievable in the basic excitation mode.

16. The method of claim 12, wherein a relational value is acquired and, based thereon, the reference parameter value is defined relative to the parameter value of the relevant parameter achievable in the basic excitation mode.

17. The method of claim 13, wherein a relational value is acquired and, based thereon, the reference parameter value is defined relative to the parameter value of the relevant parameter achievable in the basic excitation mode.

18. The method of claim 14, wherein a relational value is acquired and, based thereon, the reference parameter value is defined relative to the parameter value of the relevant parameter achievable in the basic excitation mode.

19. The method of claim 1, wherein two transmission channels of the magnetic resonance system are controlled.

20. A pulse optimization device for a magnetic resonance system with a plurality of high frequency transmission channels, the pulse optimization device comprising:
    a controller configured to determine, in a high-frequency (HF) pulse-optimization, a transmission scaling factor for each high frequency transmission channel of the plurality of high frequency transmission channels for a reference pulse train jointly specified for the high frequency transmission channels, wherein each transmission scaling factor takes into consideration a specified target magnetization;
    wherein, in determining the transmission scaling factors in the HF pulse optimization, the controller is further configured to create a target function, wherein:
    (1) the target function is created independently of a target magnetization difference during calculation of the transmission scaling factors, the target magnetization difference being a measure of a difference in an actual magnetization theoretically attained with high frequency pulses determined during the HF pulse-optimization from the specified target magnetization, and wherein the target magnetization difference is considered in the HF pulse-optimization by way of a boundary condition function; or
    (2) the target function comprises the target magnetization difference and no HF exposure value of an object to be examined, and wherein the HF exposure value is considered by way of the boundary condition function.

21. A magnetic resonance system comprising:
    a plurality of high frequency transmission channels;
    a controller configured to emit HF pulse trains in parallel in order to carry out a desired measurement via the high frequency transmission channels; and
    a pulse optimization device configured to determine, in a high-frequency (HF) pulse-optimization, a transmission scaling factor for each high frequency transmission channel of the plurality of high frequency transmission channels for a reference pulse train jointly specified for the high frequency transmission channels, wherein each transmission scaling factor takes into consideration a specified target magnetization;

wherein, in determining the transmission scaling factors in the HF pulse optimization, the pulse optimization device is further configured to create a target function, wherein:

(1) the target function is created independently of a target magnetization difference during calculation of the transmission scaling factors, the target magnetization difference being a measure of a difference in an actual magnetization theoretically attained with high frequency pulses determined during the HF pulse-optimization from the specified target magnetization, and wherein the target magnetization difference is considered in the HF pulse-optimization by way of a boundary condition function; or (2) the target function comprises the target magnetization difference and no HF exposure value of an object to be examined, and wherein the HF exposure value is considered by way of the boundary condition function.

22. In a non-transitory computer readable storage medium having stored therein data representing instructions executable by a programmed processor for controlling a magnetic resonance system and/or operating a pulse optimization device, the storage medium comprising instructions for:

specifying a joint reference pulse train for a plurality of the high frequency transmission channels;

determining, in a high-frequency (HF) pulse-optimization, a transmission scaling factor for each high frequency transmission channel of the high frequency transmission channels, wherein each transmission scaling factor takes into consideration a specified target magnetization; and calculating an individual HF pulse train for each high frequency transmission channel of the plurality of high frequency transmission channels based on the reference pulse train and the transmission scaling factor for the respective high frequency transmission channel, wherein, in determining the transmission scaling factors in the HF pulse optimization:

(1) a target function is created independently of a target magnetization difference during calculation of the transmission scaling factors, the target magnetization difference being a measure of a difference in an actual magnetization theoretically attained with high frequency pulses determined during the HF pulse-optimization from the specified target magnetization, and wherein the target magnetization difference is considered in the HF pulse-optimization by way of a boundary condition function; or (2) the target function comprises the target magnetization difference and no HF exposure value of an object to be examined, and wherein the HF exposure value is considered by way of the boundary condition function.

* * * * *